United States Patent
Glaise et al.

[19]

[11] Patent Number: 5,912,881

[45] Date of Patent: Jun. 15, 1999

[54] METHOD AND APPARATUS FOR FAST CHECKING THE FRAME CHECK SEQUENCE OF A SEGMENTED MESSAGE

[75] Inventors: R Glaise, Nice; Eric Lallemand, La Gaude; Gilles Toubol, Villeneuve-Loubet; Fabrice Verplanken, La Gaude, all of France

[73] Assignee: International Business machines Corporation, Armonk, N.Y.

[21] Appl. No.: 08/754,562

[22] Filed: Nov. 21, 1996

[30] Foreign Application Priority Data

Dec. 20, 1995 [EP] European Pat. Off. ............. 95480180

[51] Int. Cl.[6] ....................................................... H04J 3/24
[52] U.S. Cl. ............................................. 370/252; 370/389
[58] Field of Search ................................... 370/252, 389, 370/428, 429, 412, 395, 465, 463, 357, 386, 253, 229, 230, 231, 232, 235, 241, 401, 333, 338; 375/220; 379/90.01; 395/200.6; 371/2.1, 41, 54, 55, 56, 48, 53, 52, 37.5, 42

[56] References Cited

U.S. PATENT DOCUMENTS 5,742,765  4/1998  Wong et al. ............................. 370/465

FOREIGN PATENT DOCUMENTS

0544964  9/1993  European Pat. Off. .
0614294  7/1994  European Pat. Off. .

*Primary Examiner*—Dang Ton
*Attorney, Agent, or Firm*—Gerald R. Woods

[57] ABSTRACT

A process and an apparatus to calculate the FCS (Frame Check Sequence) error checking code of a message sent over a connection and segmented into a finite number of packets in a fixed size packets network. The process is implemented in the adapter cards of the ATM network access nodes (2, 4) located at the boundary of the ATM network. These nodes, when supporting AAL5 type ATM connections, reassemble messages which have been segmented at the entry of the network and to calculate the FCS of the message cell payloads for data integrity checking. The process of the invention starts at each reception of a cell with the calculation of a partial FCS (10) performed in parallel to the connection control block fetching phase (40); these 2 parallel operations allow FCS checking during the cell processing time of connections established over medium and high speed lines.

4 Claims, 10 Drawing Sheets

| $\alpha^N$ | VECTORS |
|---|---|
| $\alpha^0$ | 00000000000000000000000000000001 |
| $\alpha^1$ | 00000000000000000000000000000010 |
| $\alpha^2$ | 00000000000000000000000000000100 |
| $\alpha^3$ | 00000000000000000000000000001000 |
| $\alpha^4$ | 00000000000000000000000000010000 |
| $\alpha^5$ | 00000000000000000000000000100000 |
| $\alpha^6$ | 00000000000000000000000001000000 |
| $\alpha^7$ | 00000000000000000000000010000000 |
| $\alpha^8$ | 00000000000000000000000100000000 |
| $\alpha^9$ | 00000000000000000000001000000000 |
| $\alpha^{10}$ | 00000000000000000000010000000000 |
| $\alpha^{11}$ | 00000000000000000000100000000000 |
| $\alpha^{12}$ | 00000000000000000001000000000000 |
| $\alpha^{13}$ | 00000000000000000010000000000000 |
| $\alpha^{14}$ | 00000000000000000100000000000000 |
| $\alpha^{15}$ | 00000000000000001000000000000000 |
| $\alpha^{16}$ | 00000000000000010000000000000000 |
| $\alpha^{17}$ | 00000000000000100000000000000000 |
| $\alpha^{18}$ | 00000000000001000000000000000000 |
| $\alpha^{19}$ | 00000000000010000000000000000000 |
| $\alpha^{20}$ | 00000000000100000000000000000000 |
| $\alpha^{21}$ | 00000000001000000000000000000000 |
| $\alpha^{22}$ | 00000000010000000000000000000000 |
| $\alpha^{23}$ | 00000000100000000000000000000000 |
| $\alpha^{24}$ | 00000001000000000000000000000000 |
| $\alpha^{25}$ | 00000010000000000000000000000000 |
| $\alpha^{26}$ | 00000100000000000000000000000000 |
| $\alpha^{27}$ | 00001000000000000000000000000000 |
| $\alpha^{28}$ | 00010000000000000000000000000000 |
| $\alpha^{29}$ | 00100000000000000000000000000000 |
| $\alpha^{30}$ | 01000000000000000000000000000000 |
| $\alpha^{31}$ | 10000000000000000000000000000000 |
| $\alpha^{32}$ | 00000100110000010001110110110111 |
| $\alpha^{33}$ | 00001001100000100011101101101110 |
| $\alpha^{34}$ | 00010011000001000111011011011100 |
| ----- | ----------------ETC---------------- |

METHOD AND APPARATUS FOR FAST CHECKING THE FRAME CHECK SEQUENCE OF A SEGMENTED MESSAGE

FIELD OF THE INVENTION

This invention relates to Frame Check Sequence (FCS) error code calculation for data integrity checking of messages packetized in a high speed packet network. More particularly the invention applies to Asynchronous Transfer Mode (ATM) networks access nodes reassembling messages conveyed in ATM Adaptation Layer 5 (AAL5) type cells.

BACKGROUND OF THE INVENTION

Figure 1:
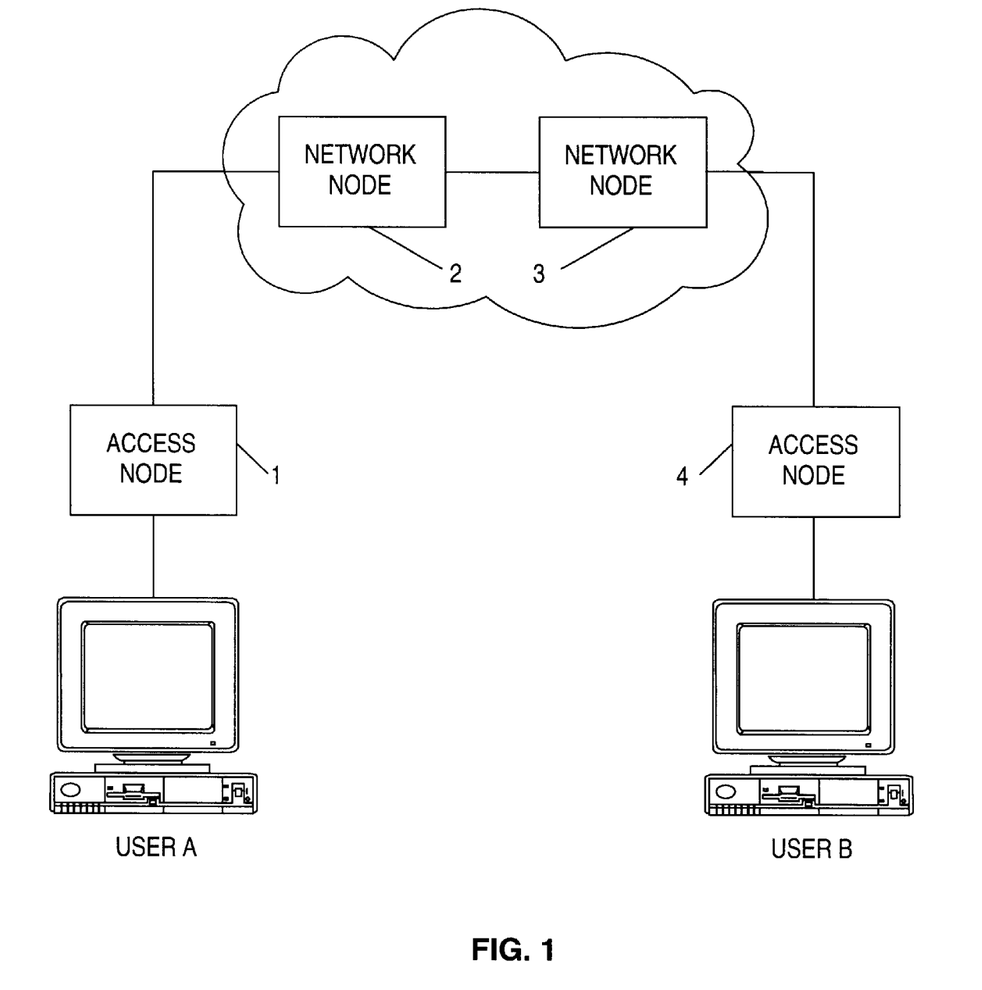
FIG. 1 depicts an ATM network.

In ATM networks the cells are transmitted over connections established from one end to another end of the network. The cells corresponding to one connection are conveyed through a series of network nodes. Nodes 1 and 4 in FIG. 1 are access nodes located at the boundary of the ATM network providing the user interface to the network; the other nodes (2, 3) are intermediate ATM network nodes; the connection represented on the figure is established between a user A and a user B. The access nodes of the ATM network have the responsibility of data integrity checking which is performed as for many digital transmission networks via FCS which is a data integrity checking code based on Cyclic Redundancy Check codes. CRC codes are generated by a generator polynomial characterizing the type of CRC; their calculations are described in 'Téléinformatique I' of Henri Nussbaumer, 1987, Presses informatiques romandes CH-1015 Lausanne. The FCS which is a code derived from CRC has been standardized for data integrity checking as described in the ANSI X3.139-1987 document pages 28 and 29 and in the Appendix B.

In ATM networks different types of connections may be established depending on the quality of service required. Some ATM standards organizations ITU-T or The International Telecommunication Union—Telecommunication and ETSI or The European Telecommunication Standardization Institute have standardized different ATM Adaptation Layers (AALs) to provide generalized interworking across the ATM network. In the case of data, this AAL function takes frames (blocks) of data delivered to the ATM network, breaks them up into cells and adds necessary header information to allow rebuilding of the original block at the receiver, usually, the header of the cell includes ordering information to reassemble the segmented message. The AAL function involves checking for errors. This function is implemented in the access nodes 1 and 4 as illustrated in the FIG. 1. Different AALs correspond to different traffic types. For instance, if AAL1 is used for the service class A, circuit emulation, AAL3/4 provides an end-to-end transport for both connection oriented (class C) and connectionless data (class D). AAL5 is designed to operate significantly more efficiently than is AAL3/4. It has become the I.364 ITU-T standard. The implementation of the AAL5 function in the access nodes is characterized by its low cost, compared to the other AAL implementations, in terms of overhead in the network nodes. Particularly, a FCS code is used for error checking which is calculated with the CRC-32 codes generated by the generator polynomial of degree 32 already used for the Ethernet protocol.

Figure 2:
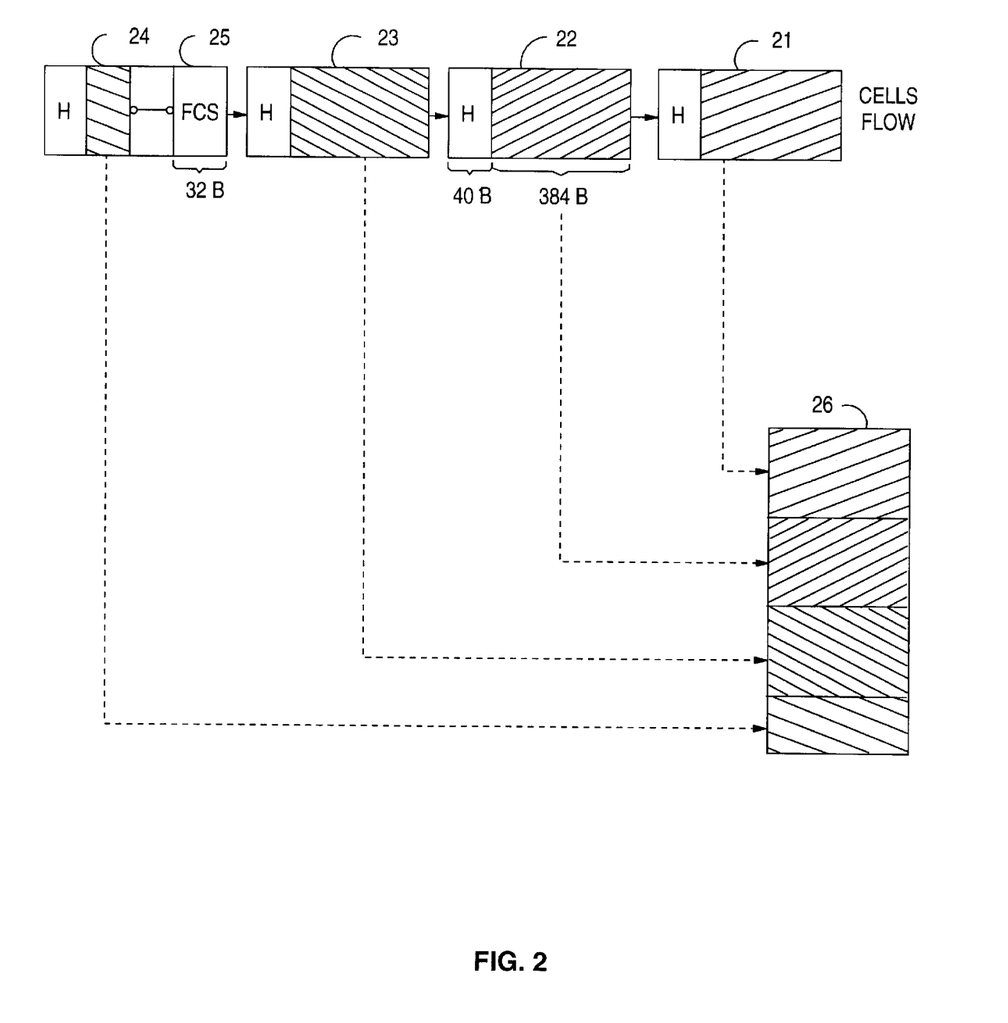
FIG. 2 depicts the reassembling of the message conveyed via AAL5 type cells.

Coming back to FIG. 1, the messages sent over one AAL5 connection from the source (A) are segmented in the access node (1) into sequences of segments of 48 bytes, the segments constituting the payload of the ATM cells which are sequentially sent over the connection. With AAL5, only the last cell of one message is identified as such with a 'end of message' bit set in the header of the cell. During the segmenting of the message in the access node (1), the last cell constituting the last segment of the message is padded with zeros if necessary, the FCS of the message is calculated and added in the last 4 bytes of the payload. At the other end of the network, the network access node (4) near the second user (B) receiving the cells containing the message is in charge of reassembling it from the cells received. The segmenting and reassembling operations on a message is shown in FIG. 2. The hatched areas represent the parts of the initial message conveyed in the payload of the data cells. In the example of FIG. 2 the message has been split into four cells; the first cells of the cells flow convey 48 bytes of message in their payloads (21, 22, 23); the last cell (24) conveys less than 44 bytes (24) the remaining bytes is padded with zeros; the last four bytes of the last cell (25) is the FCS calculated on the bits stream of the message; this code is based on CRC-32 codes based on the standardized generator polynomial of degree 32; the FCS is calculated in the segmenting access node at the entry of the ATM network. The reassembling access node reassemble the entire message (250) in the correct order from the message segments conveyed in the cells. In the reassembling access node, a FCS of the bits stream constituted of the ordered cells payloads (including the padding and the FCS field for the last cell payload) needs to be calculated for the message integrity checking. Due to the well known properties of the FCS, the FCS calculated in the reassembling node is expected to be a known fixed value.

As explained hereunder, the FCS calculated in the reassembling node for data integrity checking will be performed progressively at each arrival of an AAL5 type cell. It appears that the methods known from the prior art for progressive calculation of the FCS are not efficient enough to support the cell rate of medium and high speed ATM lines (OC3 and above).

The FCS of the AAL5 connections is based on CRC-32 calculations. We can represent bits streams as polynomials having coefficients values of 0 or 1, each power of X representing the weight of the bit in the stream. The addition of such polynomials correspond to logical addition (XORs) on their coefficients. The FCS codes of messages transported via AAL5 cells belong to the Galois Field generated by the following generator polynomial:

$$G(X)=X^{32}+X^{26}+X^{23}+X^{22}+X^{16}+X^{12}+X^{11}+X^{10}+X^{8}+X^{7}+X^{5}+X^{4}+X^{2}+X+1$$

This generator polynomial of degree 32 has been standardized for error checking in Ethernet and then chosen by the ATM standard for AAL5 error checking.

Figure 7:
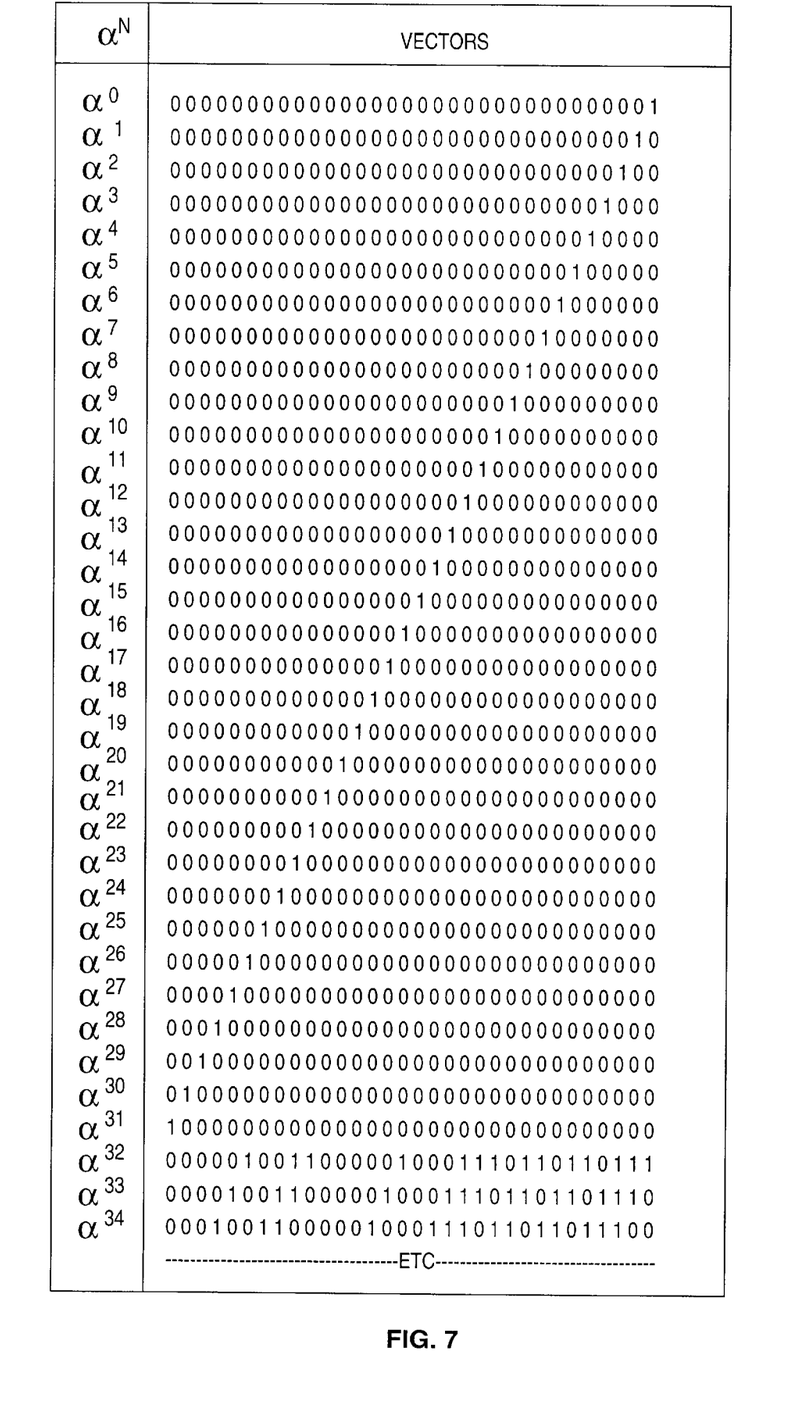
FIG. 7 illustrates the first 35 elements of the Galois Field generated by the generator polynomial of degree 32.

The polynomial representation of a CRC code of a bits stream represented by the polynomial P(X) is the remainder of the polynomial division of P(X) by the generator polynomial G(X). The remainders of degree smaller than 32, form a Galois Field having a finite number of elements. One property of the Galois Field is to have a root α, an irreducible polynomial of the Galois Field, characterized in that each element of the Galois Field is represented by $α^d$, d being one integer greater or equal to zero and smaller than the number of elements of the Galois Field. FIG. 7 illustrates the 35 first elements of the Galois Field generated by the generator polynomial of degree 32, G(X). The generator polynomial G(X) of degree 32 generates a Galois Field of:

$$2^{32}-1=4,294,967,293 \text{ elements}$$

Assuming the CRC-32 code of a data bits stream represented by the polynomial P(X) is $\text{Rem}_G(P(X))$, the corresponding e FCS code based on CRC-32 is:

$$FCS(P(X))=Rem_G(X^{32}P(X)+X^kL(X))$$

$$k=\text{degree of } P(X)$$

$$L(X)=X^{31}+X^{30}+\ldots+X^2+X+1$$

The standard circuitry for computing the FCS of a message is a Linear Feedback Shift Register (LFSR) which carries out a bit by bit multiplication in the Galois Field. Each bit of the message is pushed in the LFSR, Most Significant Bit (MSB) first. The division is performed by the feedbacks. At the end of the process, the FCS (remainder of the division) is within the shift register. This method and type of circuitry is described, for instance in 'Error Checking Codes' by Peterson and Weldon, the MIT Press, 2nd edition, 1972. Although simple the method suffers of obvious drawbacks since only one bit is processed at each shift as many shifts as the number of bits is the message is needed in the LFSR. As the 32 bits CRC is used, a 32 bits register is needed. Computing the CRC takes as many clock pulses as there are bits in the message.

Figure 4:
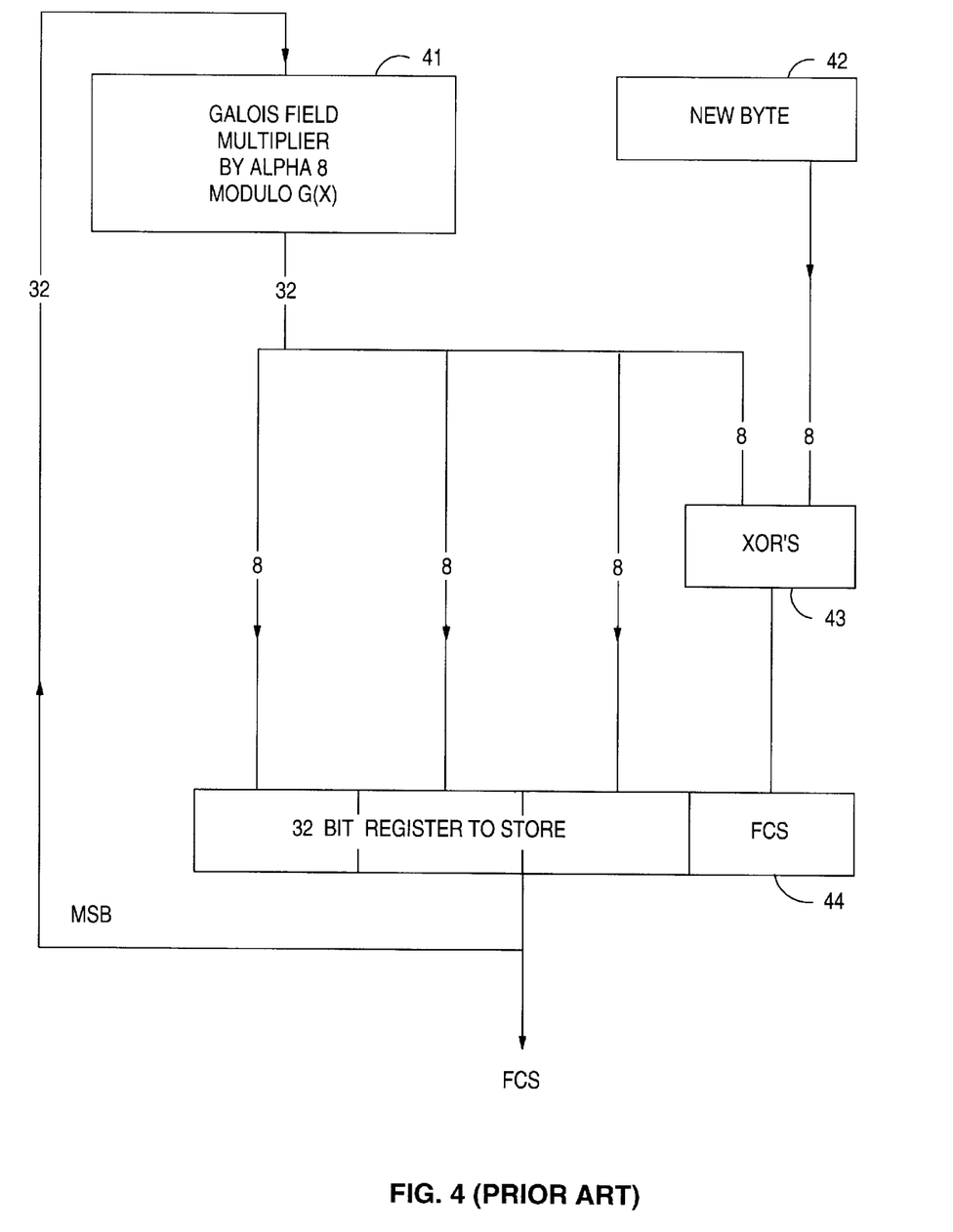
FIG. 4 is a schematic of one implementation of FCS byte calculation as known in the prior art.

A faster CRC calculation is provided in the patent application published under the reference EP 0614 294 entitled 'Method for generating a frame check sequence' disclosing a one (or more) byte (s) based FCS calculation, this method being more efficient than a bit based FCS calculation as with the LFSRs. This patent application takes advantage of the properties of the operations in the Galois Fields. As illustrated in FIG. 4, according to the preferred embodiment of the cited patent application, the calculation of FCS of a byte stream can be performed byte by byte, each new byte (42) read being XORed (43) with the result of the multiplication (41) of the previous FCS value by the $\alpha^8$ element of the Galois Field. The multiplier (41) is the implementation of the $\alpha^8$ multiplication in the Galois Field, this means modulo the polynomial generator G(X). The mathematical formula illustrating the method is expressed in the Galois Field as follows:

$$FCS(N+1)=FCS(N)\otimes \alpha^8+B(N+1) \qquad \text{(expression 1)}$$

Where FCS(N) is the FCS of the message consisting of the N previous bytes, B(N+1) the polynomial representation of the next byte (new byte) of the message.

- $\otimes$ is the sign of the polynomial multiplication in the Galois Field. It is a two steps operation comprising a first step to multiply or add the two polynomials and a second step to take the remainder of the result in the division by G.
- $\alpha$ is an irreducible polynomial, root of the Galois Field generated by G.
- $\alpha^8$ is the 9th element of the Galois Field.

This byte by byte calculation of the FCS can be efficiently used in the access node at the entry of the ATM network for a given AAL5 type connection, to calculate the FCS of one message received. As the messages received in the reassembling access node are segmented, the FCS checking is performed 'on the fly' in this node, at each reception of a new cell and not when all the cells have been received. If applied to FCS checking, the method of the cited best prior art will imply the following cell process: at the reception of the first cell of the message, the FCS is calculated byte by byte from the bytes stream of the cell payload according, for example, to the method of FIG. 4; the result is then stored in the control block of the connection as an 'intermediate FCS'. At reception of each new cell the 'intermediate FCS' is read from the connection control block and a new 'intermediate FCS' is calculated from the previous 'intermediate FCS' value and from the received cell payload still using one method of the prior art; the updated 'intermediate FCS' is stored back in the control block of the connection. When the last cell is read the result of the calculation according to the process just described returns the final expected value of the FCS checking.

Figure 3:
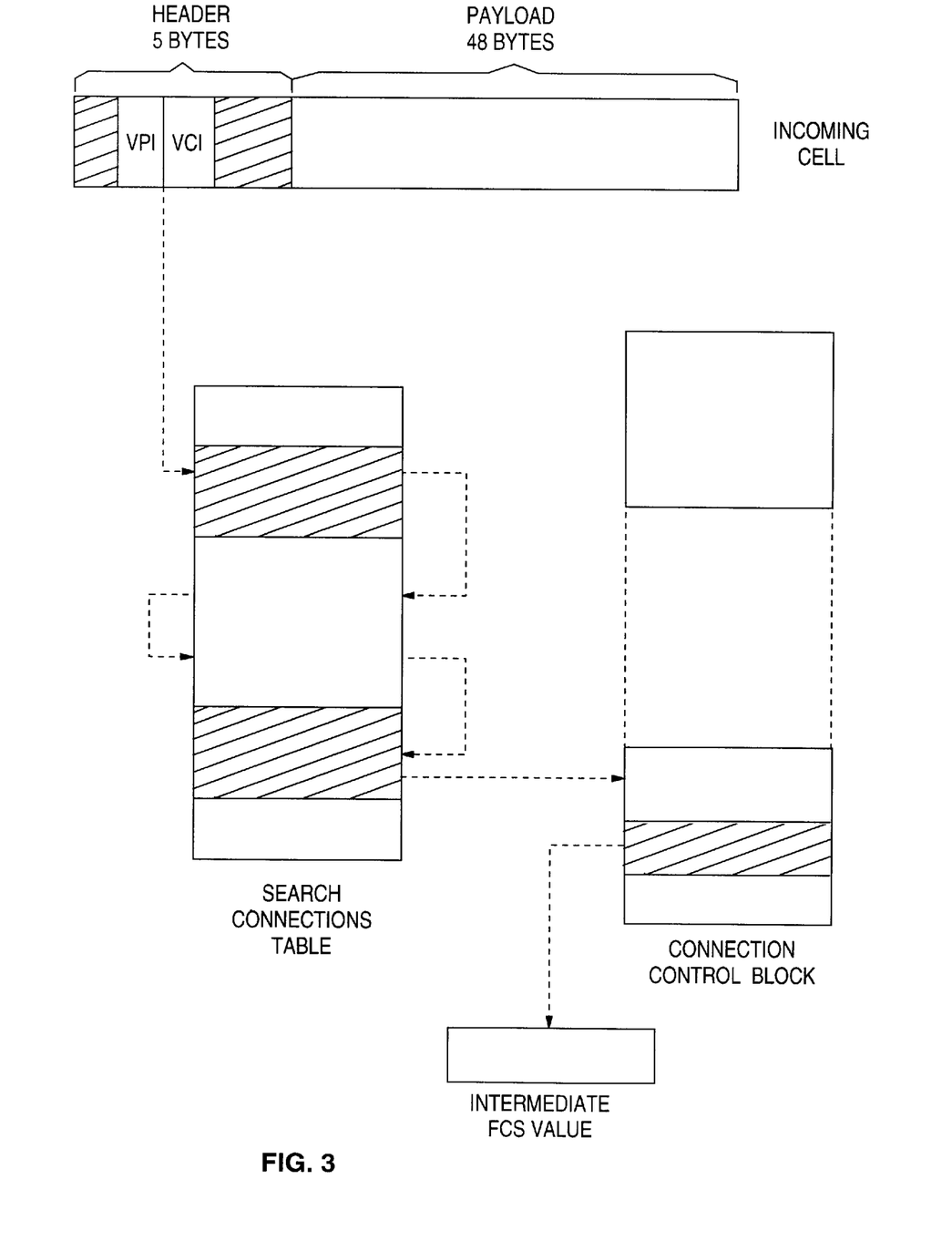
FIG. 3 illustrates the phase of fetching the control block of the connection and reading the 'intermediate FCS' value.

The FCS checking which is performed in the adapter cards of the access nodes at the output of the ATM network should be efficient enough to allow the support of high speed links. As an example, with (OC3) 155.52 Mbps links the elapsed time between cells arrival is 2.7 µs; 0.7 µs only are available for cell processing on OC12 links (622.06 Mbps). Even with the improved method of FCS byte(s) by byte(s) calculation of the prior art, it is necessary to be able to perform the intermediate FCS calculation as described during the 2.7 µs left for each cell processing. With the FCS checking process just described, one new 'intermediate FCS' calculation cannot start before the previous 'intermediate FCS' value has been read in the Control Block of the connection which needs to be fetched. This later operation is illustrated in FIG. 3; it consists first in reading the Virtual Path Identifier (VPI of 8 or 12 bits) and the Virtual Channel Identifier (VCI) identifying the connection in the cell header then a sort is performed in a Search Connection Table to find the Connection Control Block address corresponding to the connection identified; the Connection Control Block is fetched and in this block, the 'intermediate FCS' is read; this value is the FCS calculated during the reception of the preceding cell. Fetching the control block and reading the intermediate FCS value takes a significant part of the time available for cell processing. Once the intermediated FCS value is read the new intermediate FCS value is calculated and other cell processing steps need to be performed in the remaining time period. As a matter of fact, the constraints on the number of processing cycles depend on the power of processors (time cycle) used in the apparatus implementing the FCS checking (usually node adapter cards). Other computing resources needs such as storage means also have to be compatible with the type of equipment used for implementation.

Thus, with the method of the prior art and the current technologies, it is very difficult to perform the intermediate FCS calculations for data integrity checking of messages conveyed in AAL5 type cells (and more generally for fixed size packets) in ATM networks (and more generally packet networks) during the cell (packet) processing time available with medium and high speed lines (OC3 and above).

It is a first object of the invention to calculate the FCS of a message segmented over a data packet stream.

It is a second object of the invention to split the FCS calculation of the message into 'intermediate FCS' calculation steps performed at each reception of a packet and in an efficient way to support medium and high speed line speed.

It is another object of the invention to perform the FCS calculation using a minimum of other computing resources such as storage.

SUMMARY OF THE INVENTION

The process of the present invention consists in an efficient way for calculating in a reassembling packets network node the FCS based on a generator polynomial G(X), of messages segmented into payloads of a finite number of packets, the last one being identified by a field in its header, the packets belonging to the same connection established over the ATM network, the connection being identified by an identifier in the header of the packet providing the information to access a storage area dedicated to the connection; the process comprises the steps of:

receiving one packet of the message, and
calculating the FCS of the payload read in the packet,
in parallel to the previous step
    identifying the connection in the header of the packet,
    fetching the storage area of said connection,
    reading the content of said storage area,
    performing an addition modulo G(X) of the FCS calculated in parallel and the content of said storage area,
    reading in the packet header if the packet processed is the last of the message,
    if the packet processed is the last packet of the message, the result of the addition modulo G(X) being the expected FCS of the message,
        setting all the bits of the result of the addition modulo G(X) to 1,
        performing matrix multiplication of the result of the addition modulo G(X) by the matricial representation of the element $\alpha^{384}$ of the Galois Field generated by G(X), $\alpha$ being a root of said Galois Field.

The apparatus of the present invention comprises means carrying out the steps of the process just described.

Starting the calculation of the FCS at the reception of the cell avoids wasting time in waiting for the end of the connection control block fetching phase. After the fetching phase only two steps are necessary to complete the FCS calculation if the last cell received is the last cell of the message.

This short FCS calculation time allows the adapters of the ATM network access nodes located at the boundary of the ATM network to support the medium and high speed lines more and more used in the ATM networks (OC3 and above).

DETAILED DESCRIPTION OF THE PREFERRED EMBODIMENT

The process of the present invention when applied to the FCS checking of a message segmented into ATM AAL5 type cells consists, at reception of one cell, in anticipating the FCS calculation without waiting for completion of the phase of fetching the control block of the corresponding connection and reading in it the value of the 'intermediate FCS' already stored during the processing of the previous cell of the message.

Figure 5:
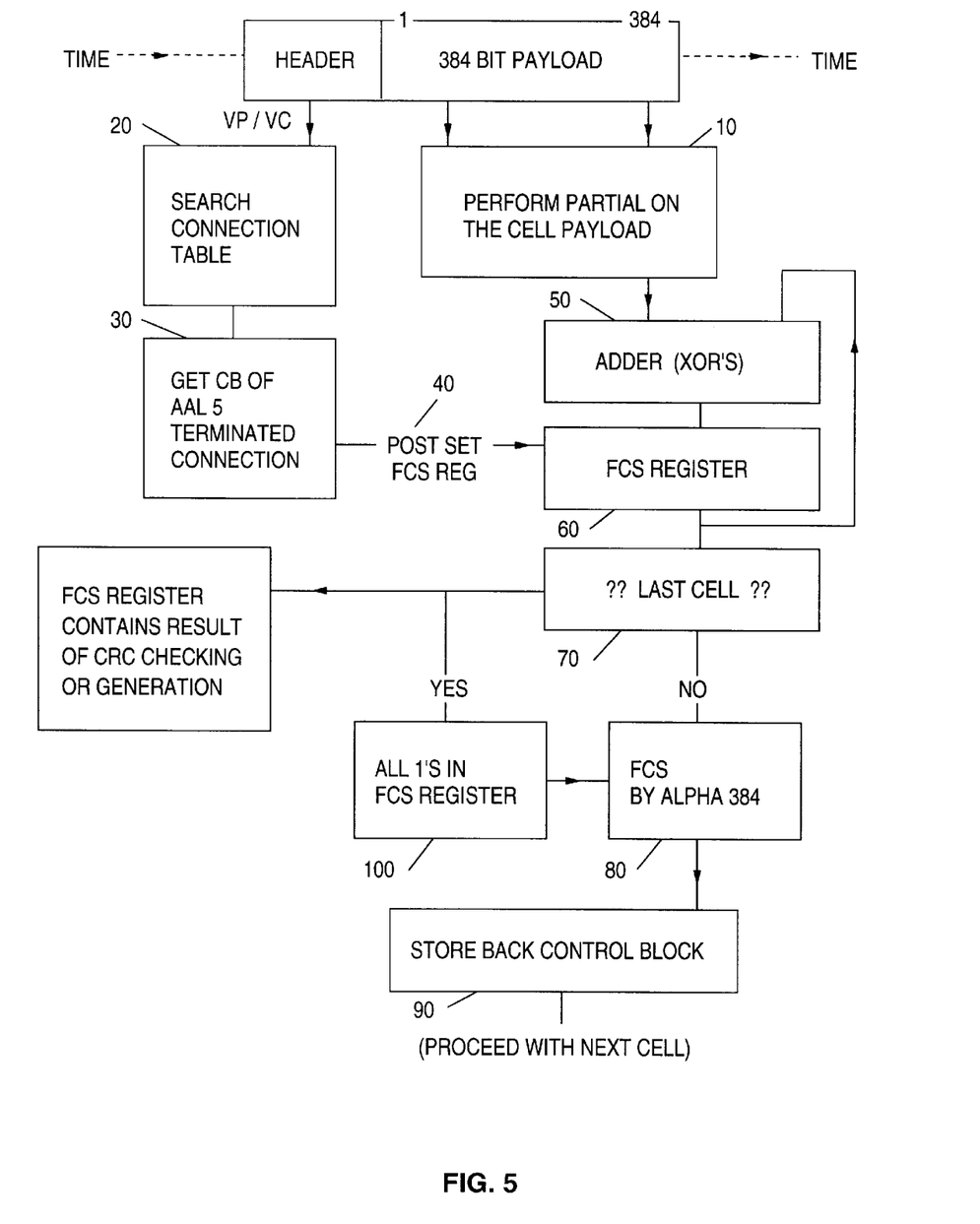
FIG. 5 is the logical diagram of the process for FCS calculation according to the present invention.
Figure 10:
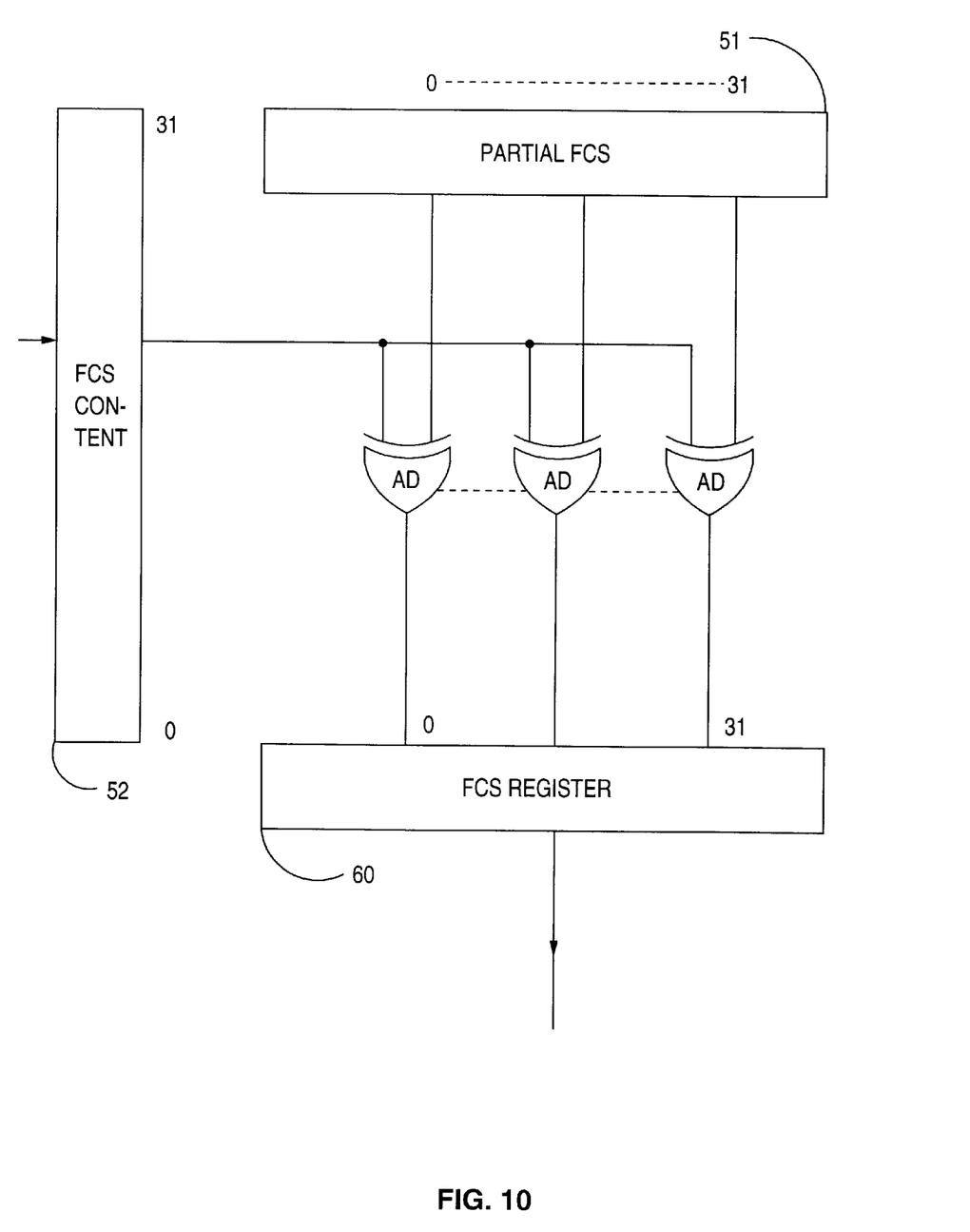
FIG. 10 illustrates the hardware implementation of addition in Galois Field generated by the polynomial G(X) of degree 32.

One preferred embodiment of the invention is located in the adapter of a high speed line of an access node performing the FCS checking of messages. As illustrated in FIG. 5, at reception of a new cell, a 'partial FCS' which is the FCS of the payload of the cell is immediately calculated (10). This FCS calculation of a 48 bytes stream can be performed by any method of the prior art; the byte by byte method of the latest cited prior art being preferred compared to the bit by bit solution with LFSRs. In parallel, the connection of the cell is identified by reading of the VP/VC field of the header of the cell. A search (20) is performed in the Search Connection Table storing pointers to the addresses of the Control Block of the connection. This search operation includes a sort in the table and the search means will be chosen between the efficient search means known in the prior art. The Control Block comprising all the information on the connection is fetched (30) and in it, the value of the 'intermediate FCS' is read and written (40) in the 'FCS register' of 4 bytes. The content of the FCS register is added (50) to the result of partial FCS calculation. The person skilled in the art implements this addition (50) with a 32×n way XOR, for example a 32×2 WAY XOR as illustrated in FIG. 10. The result of the addition of the two 32 bits vectors (51 and 52) is stored in the FCS 32 bits register (60). Each bit of the FCS register being at a given 32 bits stream position is the result of a XOR (Ad) of the two bits being at the same position in the vectors (52 and 53).

Figure 8:
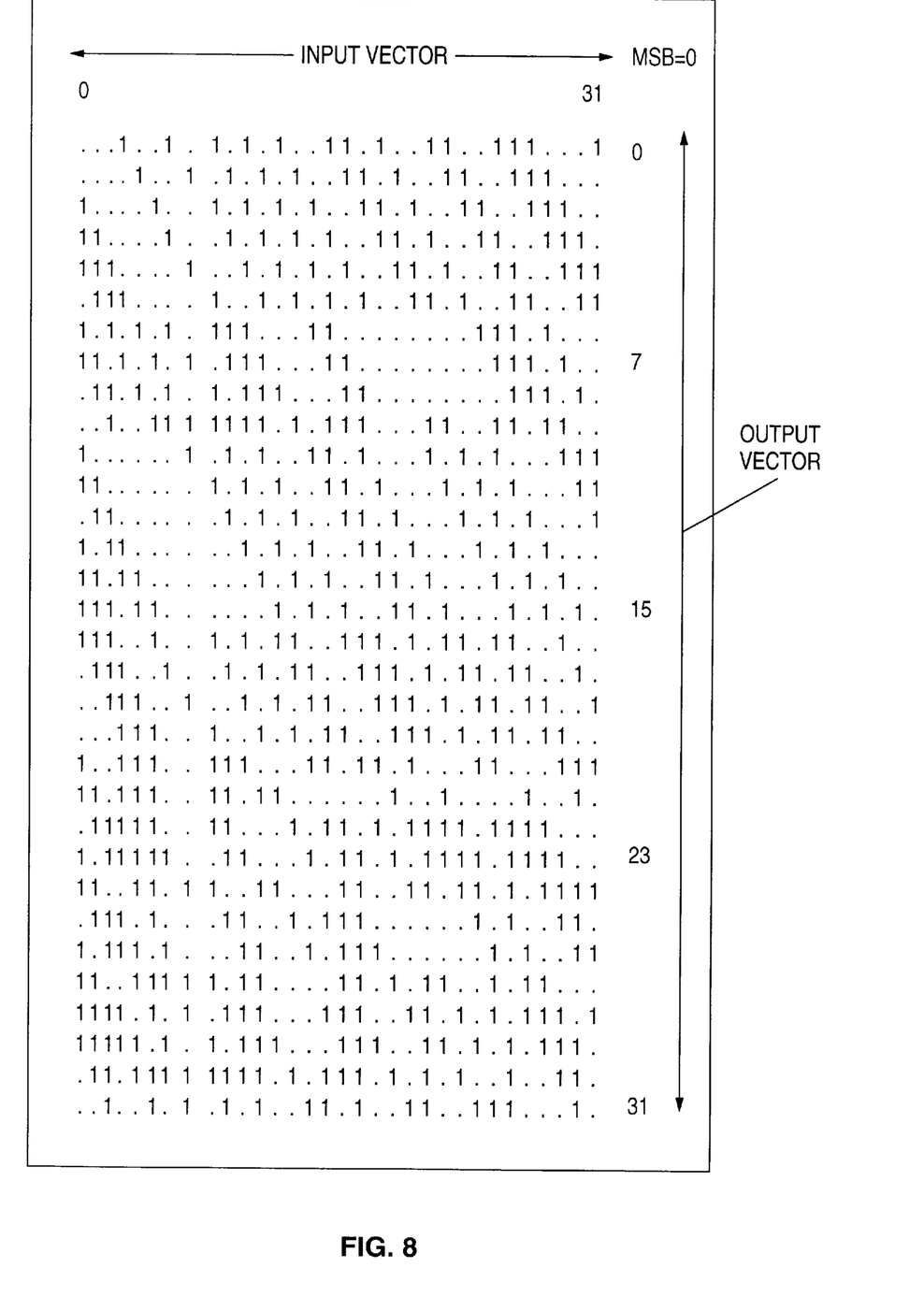
FIG. 8 is the matrix representation of the Galois Field multiplier $\alpha^{384}$.
Figure 9:
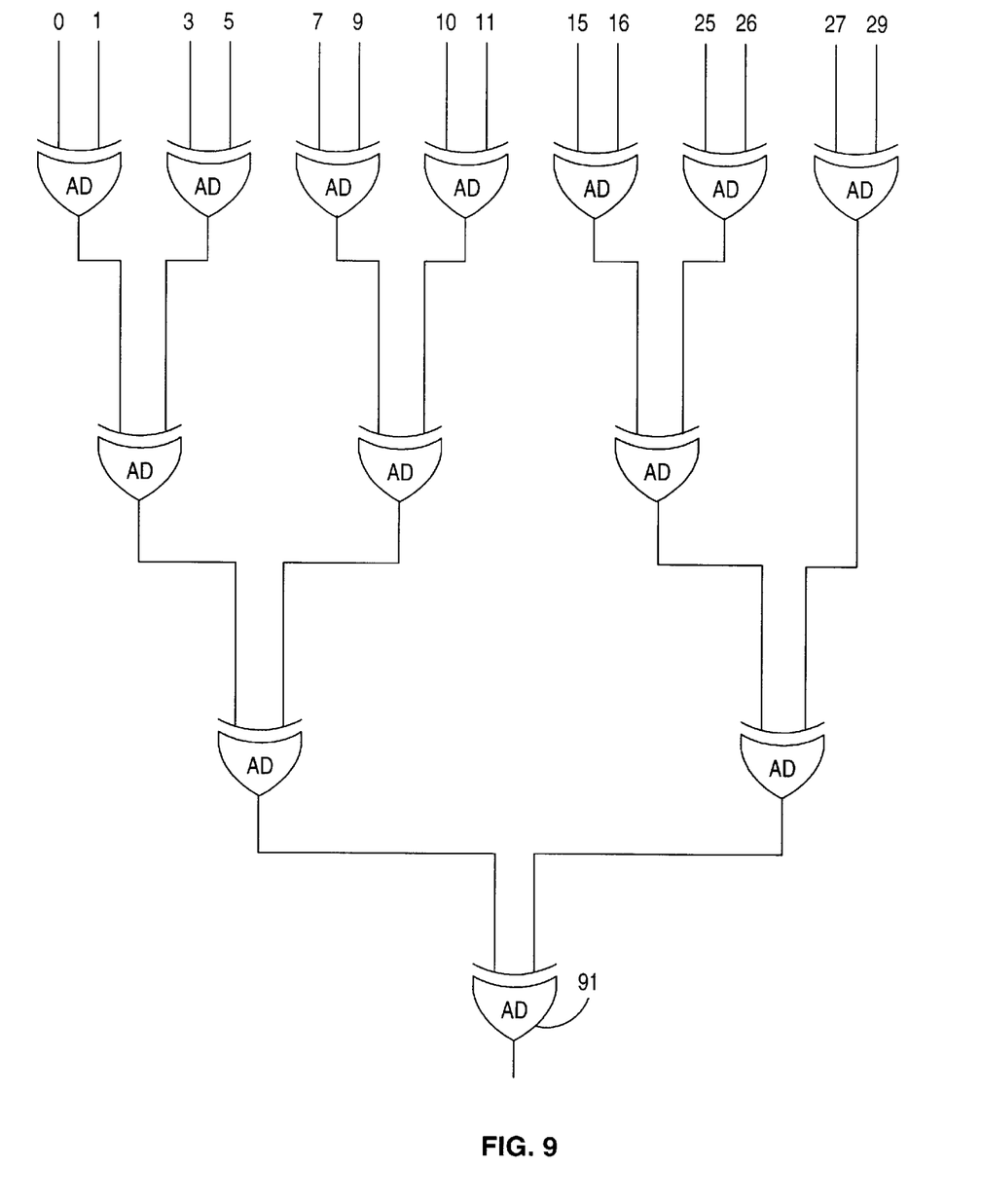
FIG. 9 depicts a hardware implementation for obtaining the bit 7 of the 32 bits vector, result of the multiplication of a 32 bits vector by $\alpha^{384}$ used in the present invention.

A test is performed (70) to check if the cell currently processed is the last cell of the message. For AAL5 the last cell has a End Of Message bit set in its header. Other means exist to identify the last cell of a segmented message; for instance with other protocols, the header of the each cell of the message includes a field storing its segment range information. The test 70 is implemented with a well known testing means. If the cell currently processed is not the last cell of the message, the content of the FCS register is multiplied (80) in the Galois Field by the $\alpha^{384}$ element. This operation can be mathematically represented by a matrix multiplication of a 32 bits vector (4 bytes) by a 32×32 matrix representing the multiplication by the Galois Field element $\alpha^{384}$; the result of this multiplication is a 32 bits vector. In the preferred embodiment of the present invention, the calculation uses a hardware implementation of the matrix corresponding to the multiplication of a 32 bits stream by $\alpha^{384}$. The matrix used for the multiplication is represented in FIG. 8. The implementation of the matrix multiplication is illustrated in FIG. 9. As an example, to calculate the bit 7 of the 32 bits resulting vector, each ordered bit of the 32 bits input vector is multiplied by the value 0 or 1 of its corresponding position on the line 7 of the matrix; then, the 32 results are added. The hardware implementation is a combinational device as illustrated in FIG. 9. The bits of the input vector have been selected according to the line 7 of the matrix and the resulting bits are those of the ranges selected in FIG. 9 (0, 1, 3, 5, 7, 9, 10, 11, 15, 16, 25, 26, 27, 29) each corresponding to a value of 1 on line 7. The addition of these bits is implemented with the successive logical XOR gates (Ad). The last XOR gate (91) comprises the value of the bit 7 of the 32 bits resulting vector. Each bit of the resulting vector is calculated in the same way and the implementation of the matrix of FIG. 8 is a series of 32 combinational devices built as described in FIG. 9. Coming back to FIG. 5, the result of the multiplication (80) is the 'intermediate FCS' value which is stored back (90) in the control block of the cell connection which has been fetched in the control block reading operation of operation 30.

Coming back to the test 70 of FIG. 5, if the cell processed is the last cell of the message, the value stored in the FCS according to the operation 60 of the method of the invention is the FCS that was to be calculated for data integrity checking of the message.

An initial 'intermediate FCS' value is then calculated by setting all the 32 bits of FCS register to 1 (100) and multiplying by $\alpha^{384}$ (80) in the Galois Field the all 1's bits of the FCS register. The result of this multiplication is stored back (90) in the control bloc of the connection as an initial 'intermediate FCS' value in anticipation of receipt of the next message. At the reception of the first cell of the next arriving message, the calculation of FCS according to the method of the invention will start again using this initial 'intermediate FCS' value.

Figure 6:
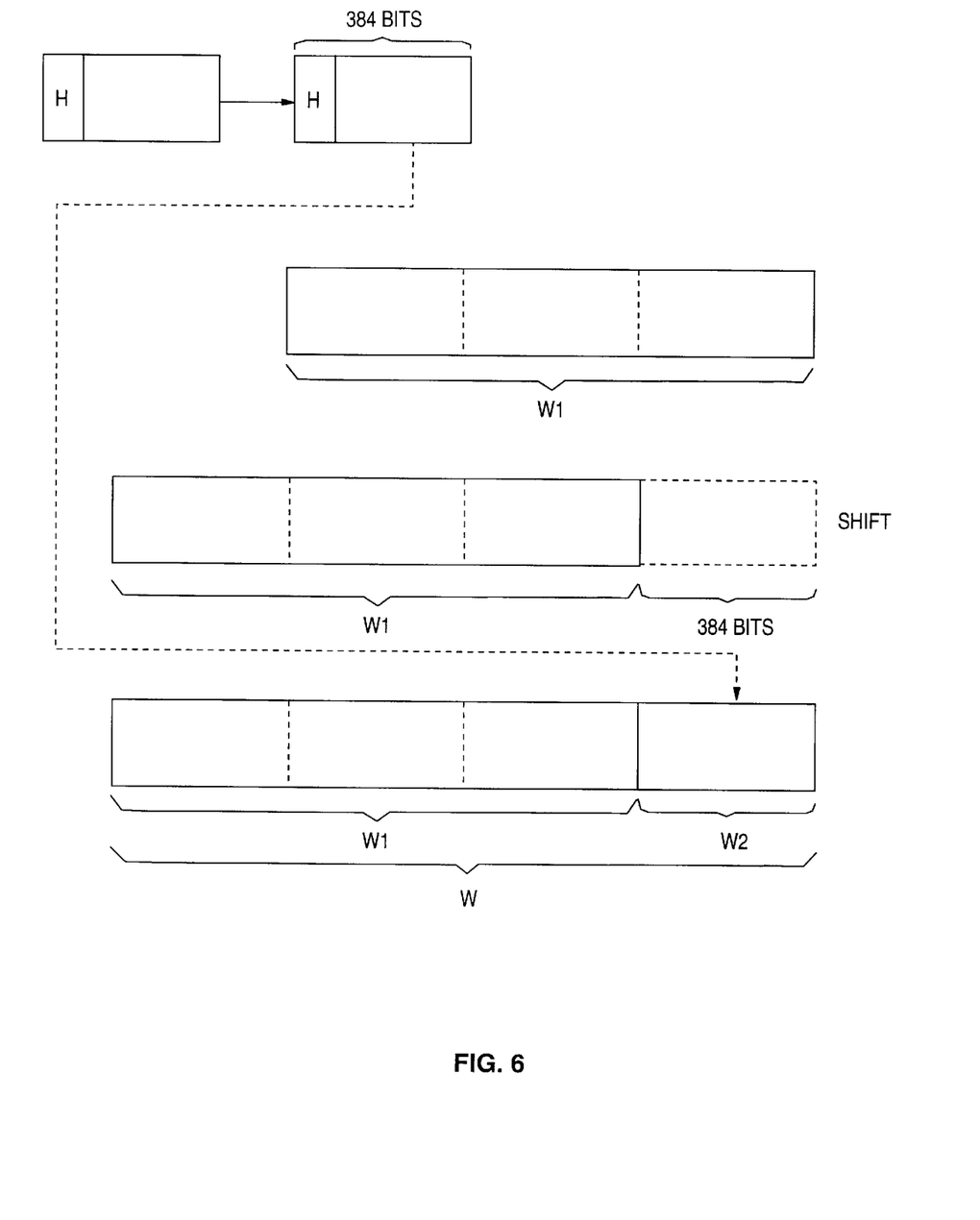
FIG. 6 illustrates the intermediate reassembling of the message at reception of a new cell.

This process is characterized by the fact that the FCS of one message comprising n cell payloads of 48 bytes (or 384 bits) can be calculated knowing the FCS of n−1 payloads. As illustrated in FIG. 6, assuming that a message w is transported in n cells, if w1 is the message reassembled from the n−1 first cell payloads and w2 is the last cell payload read (n th) the FCS of the message w comprising n cells is, as illustrated in FIG. 7 built by a SHIFT step of 384 bits and a step of replacement of these 384 bits by the w2 bits stream corresponding to the cell payload just received. Using the polynomial representation of the bits stream we can mathematically illustrate the FCS checking:

$$w = w2 + X^{384} w1$$

Due to the linearity of the FCS:

$$FCS(w) = FCS(w2) + FCS(X^{384} w1)$$

$$FCS(w) = FCS(w2) + Rem_G(X^{384} w1 + X^{384n} L(X))$$

$$L(X) = X^{31} + X^{30} + \ldots + X^2 + X + 1$$

$$FCS(w) = FCS(w2) + Rem_G(X^{384}(w1 + X^{384(n-1)} L(X)))$$

$$FCS(w) = FCS(w2) + \alpha^{384} Rem_G(w1 + X^{384(n-1)} L(X))$$

$$FCS(w) = FCS(w2) + \alpha^{384} FCS(w1) \qquad \text{expression 2}$$

In expression 2 we note that the '+' operation of the FCS corresponds to the 32 XORs of operation 50 of FIG. 5 and the multiplication by $\alpha^{384}$ corresponds to the matrix calculation 80. The initialization of the FCS to all 1's corresponds to the polynomial addition of L(X) used in operation 100. The FCS of the first cell payload of the next message received is (w=w2, w1=0, n=1) as indicated in expression 2:

$$FCS(w) = FCS(w) + \alpha^{384} Rem_G(0 + X^0 L(X))$$

$$FCS(w) = FCS(w) + \alpha^{384} Rem_G(L(X))$$

$$FCS(w) = FCS(w) + \alpha^{384} L(X)$$

$\alpha^{384}$ L(X) being the result of operation 100 of initialization.

We claim:

1. For use in a fixed size packet network, a process for calculating a Frame Check Sequence value based on G(X) for a message segmented into the payloads of a finite number of packets, the last packet being identified by its header, said packets belonging to a single connection established over the packet network, said single connection being identified by an identifier in the header of the packets, said identifier allowing access to a connection storage area, said process being characterized in that it comprises the steps of:

receiving one packet of the message, calculating a Frame Check Sequence value for the payload received in the packet, in parallel with the previous step, identifying the connection from the connection identifier in the header of the packet, fetching the content of the connection storage area allocated to said connection, reading the content of said connection storage area, performing an addition modulo G(X) of said calculated Frame Check Sequence value and the content of said connection storage area, determining from the packet header whether the packet processed is the last packet of the message, if the packet processed is the last packet of the message, setting all the bits of the result of the addition modulo G(X) to 1, performing a matrix multiplication of the result of the addition modulo G(X) by the matrix representation of the element $\alpha^{384}$ of the Galois Field generated by G(X), $\alpha$ being the root of said Galois Field, and storing the resulting value in said connection storage area.

2. The process of claim 1 where the step of calculating the Frame Check Sequence value for the payload is performed bit by bit.

3. The process of claim 1 where the step of calculating the Frame Check Sequence value for the payload is performed byte by byte.

4. For use in a node in a fixed size packet network, an apparatus for calculating a Frame Check Sequence value based on generator polynomial G(X) of a message segmented into the payloads of a finite number of packets, the last packet being identified in its header, said packets belonging to a single connection established over the packet network, said single connection being identified by an identifier in the header of the packets, said identifier allowing access to a connection storage area, said apparatus being characterized in that it comprises:

a storage device for receiving one packet of the message, logic for calculating the Frame Check Sequence value for the payload of the received packet, logic for, in parallel with the previous step identifying the connection on which the received packet was received based on the header of the packet, a read circuit for fetching the content of the connection storage area, an adder circuit for performing an addition modulo G(X) of said calculated Frame Check Sequence value and the content of said connection storage area, logic for examining the packet header to determine if the packet processed is the last packet of the message, logic responsive to a determination that the packet processed is the last packet of the message for setting all of the bits of the rsult of the addition modulo G(X) to 1, logic for performing the matrix multiplication of the result of the addition modulo G(X) by the matrix implementation of the element $\alpha^{384}$ of the Galois Field generated by G(X), $\alpha$ being the root of said Galois Field, and write logic for storing the result of the matrix multiplication in said connection storage area.

* * * * *